United States Patent [19]

Schultz et al.

[11] Patent Number: 4,940,842

[45] Date of Patent: Jul. 10, 1990

[54] METHOD FOR PREPARING SUPERCONDUCTING OXIDE FILMS BY SEEDING FORMATION AND HEAT TREATMENT

[75] Inventors: Ludwig Schultz, Bubenreuth; Joachim Wecker, Erlangen, both of Fed. Rep. of Germany

[73] Assignee: Siemens Aktiengesellschaft, Berlin & Munich, Fed. Rep. of Germany

[21] Appl. No.: 302,827

[22] Filed: Jan. 26, 1989

[30] Foreign Application Priority Data

Jan. 27, 1988 [DE] Fed. Rep. of Germany ....... 3802349
Oct. 13, 1988 [DE] Fed. Rep. of Germany ....... 3834964

[51] Int. Cl.$^5$ ........................... B05D 5/12; B05D 3/06
[52] U.S. Cl. ......................................... 508/1; 427/62; 427/43.1; 427/53.1; 427/54.1; 505/730; 505/729; 505/742; 156/603
[58] Field of Search .................... 427/53.1, 54.1, 62, 427/63, 43.1; 505/1, 729, 742, 730, 818, 819; 156/603

[56] References Cited

U.S. PATENT DOCUMENTS 4,316,785 2/1982 Suzuki et al. ........................ 427/63
4,383,383 5/1983 Mizutani ............................ 156/603

FOREIGN PATENT DOCUMENTS 0127499 12/1984 European Pat. Off. .
61-104345 9/1986 Japan .

OTHER PUBLICATIONS

Aizaki et al, "YBa$_2$Cu$_3$O$_y$ Superconducting Thin Film Obtained by Laser Annealing", Jpn. J. Appl. Phys. 27(2), Feb. 1988, L 231–233.
Minamikawa et al, "Preparation of Ba$_2$YCu$_3$O$_x$ Superconducting Films by Laser Evaporation and Rapid Laser Annealing", Jpn. J. Appl. Phys. 27(4), Apr. 1988, L 619–621.
Politis et al, "Preparation and Superconducting Properties of La$_{1.8}$Sr$_{0.2}$CuO$_4$ and YBa$_2$Cu$_3$O$_{6.5}$", MRS ed. by Gubser, Apr. 1987, pp. 141–144.
Tsurumi et al, "High-Tc Superconductivities of (Y$_{1-x}$Yb$_x$)$_2$Ba$_4$Cu$_6$O$_{14+Y}$(O<Y<25)", Jpn. J. Appl. Phys., vol. 26(5), May 1987, L 704–705.
Wu et al, "Study of High Tc YBa$_{2-x}$Sr$_x$Cu$_3$O$_y$ Compound System", MRS ed. by Gubser et al, Apr. 1987, pp. 69–71.
Lam et al, "MOSFETs Fabricated in {100} Single Crystal Silicon-on-Oxide Obtained by a Laser-Induced Lateral Seeding Technique", International Electron Devices Meeting, Technical Digest, Washington, D.C. (Dec. 1980), pp. 559–562.
Physical Revue Letters, vol. 58, No. 25, 6/22/87, pp. 2684–2686.
MRS Symposium on High–Temperature Superconductors, Anaheim, Calif., Apr. 23 & 24, 1987–"Superconducting Thin Films of the Perowskite Superconductors by Electron-Beam Deposition".
Europhysics Letters, vol. 3, No. 12, 6/15/87, pp. 1301–1307.
Izvestija Akademni Nauk SSSR, Ser. Fiz., vol. 39, No. 5, 5/75; pp. 1080–1083.
Japanese Journal Appl. Phys., vol. 26, No. 7, 7/87, pp. L1221–1222.
Appl. Phys. Lett. 51, vol. 21, 11/23/87, pp. 1753–1755.

*Primary Examiner*—Shrive Beck
*Assistant Examiner*—Roy V. King
*Attorney, Agent, or Firm*—Kenyon & Kenyon

[57] ABSTRACT

A superconducting oxide film is prepared by a method of seeding formation and heat treatment which comprises depositing a layer of a metal-oxide precursor on a predetermined substrate, forming a seed of a predetermined superconducting phase only in a locally limited region of the metal-oxide precursor at a boundary surface to the substrate by means of a solid-state reaction triggered by pulsed energy radiation, and then at least partially converting the metal-oxide precursor into the desired superconducting metal-oxide phase by a heat treatment in the oxygen atmosphere at a temperature below 800° C.

23 Claims, 1 Drawing Sheet

METHOD FOR PREPARING SUPERCONDUCTING OXIDE FILMS BY SEEDING FORMATION AND HEAT TREATMENT

BACKGROUND OF THE INVENTION

The present invention relates to a method for the preparation of at least one layer of a superconducting material with a high transition temperature on the basis of a material system containing metallic components and oxygen. In this method, a layer of a metal-oxide preliminary product of the component of the system with a structure still exhibiting faults with respect to the superconducting metal-oxide phase to be formed is first applied to a predetermined substrate, and the desired superconducting metal-oxide phase is subsequently formed, using a heat treatment in an oxygen atmosphere. Such a method is suggested, for instance, from "Physical Revue Letters", Vol. 58, No. 25, June 22, 1987, pages 2684 to 2686.

Films or thin layers of superconducting metal oxide compounds with high transition temperatures $T_c$ of above 90° K. are generally known. These metal-oxide compounds generally contain several metallic components and oxygen and can have, for instance, a composition of the type Me1-Me2-Cu-O (Me1=rare earths including yttrium; Me2=earth alkali metals). Films with such a composition are frequently prepared by special vapor deposition or sputtering processes. An intermediate product of the components of the chosen material system is deposited on a suitable substrate with a structure which still has faults with respect to the superconducting metal oxide phase to be developed. This preliminary product is subsequently converted into the material with the desired superconducting phase by a heat treatment which must generally be carried out while oxygen is being supplied.

The superconducting metal oxide phases which can be obtained in this manner and the structures of which are similar to those of a perovskite, have an orthorhombic structure in the case of $YBa_2Cu_3O_{7-x}$ with $0<x<0.5$ (see, for instance, "Europhysics Letters", Vol. 3, No. 12, June 15, 1987, pages 1301 to 1307). Since these materials having superconducting phases are similar to oxide ceramics, the corresponding high-$T_c$ superconductors are frequently also called oxide-ceramic superconductors.

In addition, it is also known from the publication "Phys. Rev. Lett." mentioned above to prepare monocrystalline films of the system $YBa_2Cu_3O_{7-x}$ on a monocrystalline $SrTiO_3$ substrate. For this purpose, the three metallic components of the system are vapor-deposited first from separate evaporation sources in an oxygen atmosphere onto the substrate which is at about 400° C. The intermediate product so obtained still has faults with respect to the desired superconducting high-$T_c$ phase. By means of a subsequent heat treatment at a high temperature of about 800° to 900° C. and while oxygen is being supplied, epitaxially grown monocrystalline or at least highly textured film layers with the desired superconducting high-$T_c$ phase are obtained. Films prepared in this manner exhibit a high critical current density of more than $10^5$ A/cm$^2$ at 77° K.

This epitaxy, however, is a necessary condition for the achievement of such high critical current densities which thereby can also open up wide areas of application for such superconducting films. Thus, for instance, such metallizing layers on semiconducting components are conceivable. The mentioned high-temperature process for forming the desired superconducting high-$T_c$ phase, however, is generally not compatible with the usual process steps for the preparation of semiconductor circuits.

SUMMARY OF THE INVENTION

It is therefore an object of the present invention to develop the known method of the type mentioned above such that with it, layers capable of carrying large currents at distinctly lower temperatures can be prepared, so that damage to semiconducting components which may be connected to these layers can be avoided.

The above and other objects of the invention are achieved by a method for the preparation of at least one layer of a superconductor material with a high transition temperature on the basis of a material system containing metallic components and oxygen, in which method a layer of a metal-oxide preliminary product of the components of the system with a structure still exhibiting faults with respect to the superconducting metal oxide phase to be formed is first applied to a predetermined substrate and the desired superconducting metal-oxide phase is subsequently formed, using a heat treatment in an oxygen atmosphere, wherein first a seed of a predetermined phase of the material system is formed only in a locally limited region of the preliminary product at the boundary surface to the substrate by means of a solid-state reaction triggered by pulsed energy radiation, and that then an at least partial conversion of the preliminary product into the desired superconducting metal-oxide phase is carried out by means of the heat treatment in the oxygen atmosphere at a predetermined temperature below 800° C.

The invention is based on the insight that at the boundary surface of the intermediate product and the substrate, a monocrystalline or at least highly textured film is generated by heterogeneous seed formation. The specific problem of heterogeneous seed formation is now solved in such a manner that initially, an individual seed is formed by at least one pulse of an energy source such as a laser. Once this seed is formed it can continue to grow through the entire layer at substantially lower temperatures than with the known method. I.e., the advantages connected with the embodiment of the method according to the invention are in particular that after the formation of the seed, only distinctly lower temperatures are required to obtain a monocrystalline or at least heavily textured film with high current-carrying capacity. Thereby, the use of such layers particularly in semiconductor technology is made possible.

BRIEF DESCRIPTION OF THE DRAWINGS

For a further explanation of the invention, reference is made to the drawings, in FIGS. 1 to 3 of which individual steps for carrying out the method according to the invention are illustrated with the aid of an embodiment. In the drawings corresponding parts are provided with the same reference symbols.

DETAILED DESCRIPTION

Figure 1:
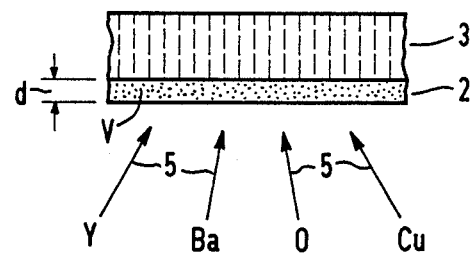

With the method according to the invention, at least one layer or at least one film of a known superconducting high-$T_c$ material can be prepared on a predetermined substrate. The composition of such superconducting materials is based on a material system containing metallic components and oxygen. The specific material systems Me1-Me2-Cu-O is chosen as an embodiment. The method according to the invention is not limited to this specific material system, however; i.e., other multicomponent oxide-ceramic high-$T_c$ superconductor materials can be used just as well which cannot be counted among this specific material system and contain at least partially other and/or additional metallic components and oxygen, and have transition temperatures above 77 K. Examples for this would be the material system Bi-Sr-Ca-Cu-O or Tl-Ba-Ca-Cu-O. The layer to be prepared according to the invention, the material of which has the composition Me1-Me2-Cu-O, according to the chosen embodiment should generally have a thickness of less than 10 $\mu$m and preferably less than 1 $\mu$m and guarantee a high current-carrying capacity in the order of magnitude of at least $10^4$ A/cm$^2$ in the vicinity of the transition temperature $T_c$ of the material. Optionally, however, also thicker layers, for instance, up to 100 $\mu$m can be produced with the method according to the invention. As the starting materials of the layer, Me1 and Me2 can be chosen from the group of rare earth metals such as Y or La or from the group of earth alkali metals such as Sr or Ba. Besides Y, materials suitable for Me1 are generally known. The corresponding metallic components of the system Me1-Me2-Cu-O should always contain at least one (chemical) element from the mentioned groups or consist of this at least one element. I.e., Me1 and Me2 are preferably present in elementary form. Optionally, however, also alloys or compounds or other compositions of these metals with substitution materials as the starting materials are suitable; i.e., at least one of the mentioned elements can be substituted in a manner known per se partially by another element. Thus, for instance, the metallic components Me1 and Me2 can respectively be replaced by another metal from the group of the metals provided for these components. Also the copper or the oxygen can be partially substituted, for instance, by F. The materials to be chosen for the substrate are in particular those which at least contain Al$_2$O$_3$, ZrO$_2$, MgO, SrTiO$_3$ or BaTiO$_3$. In particular, perovskite-oxide materials are suitable, the lattice constants of which (unit cells) have dimensions which amount at least approximately to one or several times the corresponding quantities of the structures of the superconducting high-$T_c$ material growing thereon. For this reason, a monocrystalline SrTiO$_3$ substrate is particularly advantageous in the case of YBa$_2$Cu$_3$O$_{7-x}$. Such substrates with a texture of this type are generally known (see, for instance, "Izvestija Akademii Nauk SSSR", Ser. Fiz., Vol. 39, No. 5, May 1975, pages 1080 to 1083).

Figure 2:
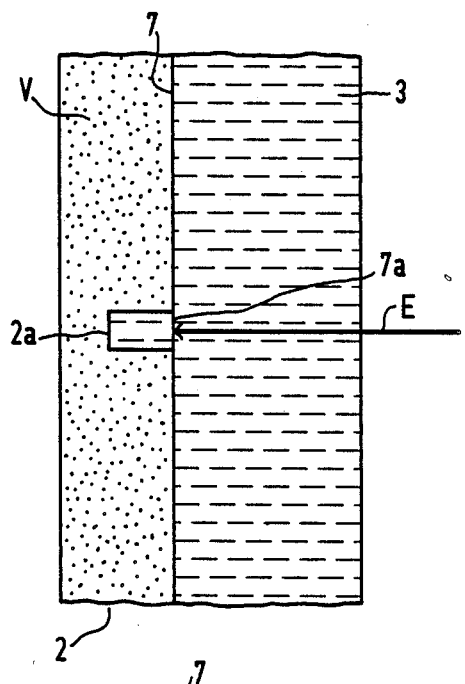
Figure 3:
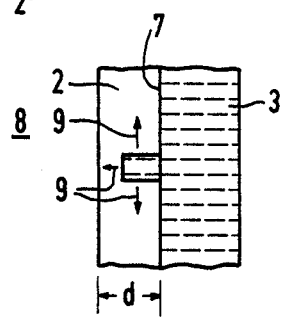

As a corresponding concrete embodiment, the cross sections schematically shown in FIGS. 1 to 3 are based on the preparation of a layer of a material of the known composition YBa$_2$Cu$_3$O$_{7-x}$. This layer 2 is to be formed on a substrate 3. The substrate can in particular be monocrystalline SrTiO$_3$ or (Ba, Sr)TiO$_3$. Optionally, also substrates are suitable, in which an SrTiO$_3$ or (Ba, Sr)TiO$_3$ layer with fine crystalline structure is deposited, for instance, by vapor deposition or sputtering on a carrier body where this structure exhibits a texture with a predetermined pronounced orientation. Optionally, at least a thin layer on a carrier is provided as the substrate.

According to FIG. 1, one deposits first on the thin monocrystalline and optically transparent SrTiO$_3$ substrate 3 reactively a thin layer 2 of the metallic components Y, Ba and Cu of the material systems in a known PVD (physical vapor deposition) process known per se while oxygen is being supplied simultaneously, up to a maximum layer thickness d of, for instance, less than 10 $\mu$m. For preparing such a layer, one starts with targets of the three high-purity metallic components of the system. As is to be indicated in FIG. 1 by lines 5 with arrows, the material of these three metallic targets Y, Ba and Cu is then deposited, for instance, by means of an RF-aided laser evaporation system together with oxygen O as the gas or as an ion stream on the substrate 3 where at least the stoichiometry of the three metallic components must tally. In this connection a sufficient amount of oxygen must also be introduced so that the desired superconducting structure of the metal oxide can form. The oxygen concentration which is optimum with respect to the superconducting processes can, of course, be adjusted subsequently in a manner known per se.

When depositing the components of the system, the substrate 3 can advantageously be kept at a relatively low temperature. Suitable temperatures are, for instance, between 400° C. and room temperature. Suitable deposition systems are generally known. The individual process parameters for the deposition process such as, in particular, pressure and rate of deposition are adjusted so that the layer 2 grows gradually on the substrate 3 up to the mentioned layer thickness d. At the end of the deposition process, a still random Y-Ba-Cu-O preliminary product V of the superconducting material to be produced is present which, however, still has structural faults with respect to the desired high $T_c$ phase. The preliminary product is generally amorphous or polycrystalline.

Deviating from the described reactive RF-aided laser evaporation for depositing the preliminary product V, also other PVD processes such as sputtering or vapor deposition by means of three separate electron beam sources while oxygen is simultaneously supplied as the gas or as an ion stream is possible (see, for instance, preprint of the contribution by R. H. Hammond et al with the title: "Superconducting Thin Film of Perovskite Superconductors by Electron-Beam Deposition", to "MRS Symposium on High-Temperature Superconductors, Anaheim, California, Apr. 23 and 24, 1987").

Likewise, also chemical methods such as CVD (chemical vapor deposition) are suitable instead of physical processes for depositing the layer 2 of the still random preliminary product V.

According to the detail shown in FIG. 2 of the layer to be produced a seed 2a of the tetragonal or orthorhombic phase with the composition Y$_1$Ba$_2$Cu$_3$O$_{7-x}$ is developed in the preliminary product V which still has a fault structure at the boundary surface 7 with the substrate 3 spotwise; i.e., in a small locally limited region 7a with a small area of, for instance, less than 0.5 mm$^2$. This takes place in a solid-state reaction known per se which is triggered by a pulse-like energy radiation E. For this purpose, a laser with predetermined energy, wavelength, and pulse length is particularly well suited. Thus, a CO$_2$—, Nd-YAG or excimer laser can be used. The wavelengths of these lasers are approximately 10 um and 1064 nm or, in the case of the excimer laser (depending on the gas used) 308 nm. The wavelength of the laser to be provided is chosen so that the radiation is absorbed only at the boundary surface 7 with the (absorbing) substrate 2. Optionally, other methods can also be used, with which a pulse-like beam with sufficient energy density can be developed. Via an at least one laser pulse E assumed in the embodiment which has, for instance, a pulse length of about 50 nsec, a pulse frequency of about 1 to 10 Hz and an energy density of less than 1 J/cm$^2$, the preliminary product V is now heated locally through the transparent substrate 3 to the extent that the desired phase formation is carried out at the boundary surface 7. Through the epitaxial influence of the substrate, the seed 2a with the desired preferred orientation is then formed in the process.

As is to be indicated by the detail of FIG. 3, a complete or partial conversion of at least parts of the preliminary product into the desired perovskite-like structure with the orthorhombic superconducting high-$T_c$ phase of the $YBa_2Cu_3O_{7-x}$ is carried out by an annealing step known per se in an oxygen atmosphere 8, for instance, in an oxygen stream. Contrary to the method found in the above-mentioned literature reference "Phys. Rev. Lett.", this heat treatment can be carried out advantageously at a relatively lower temperature below 800° C., especially below 700° C. and above 500° C. While at these temperatures the seed formation rate is relatively low, growth, indicated in FIG. 3 by lines 9 with arrows, of the already formed seed remains possible. The low reaction temperature further guarantees advantageously that the superconducting orthorhombic crystal structure is generated in place of the semiconducting tetragonal structure.

During the deposition of the metal oxide film of the preliminary product V which still has a structure with faults, a transparent film is frequently generated. In this case, the laser pulse E can also be sent through the applied transparent layer. In order to achieve local heating at the boundary surface 10, the substrate 3 should not be transparent. For 28 intrinsically transparent $SrTiO_3$, this can be achieved, for instance, by an annealing step in a high vacuum prior to the deposition process. This has the advantage that the treatment can take place through the film 2.

If a polycrystalline substrate is used, for instance, polycrystalline vapor-deposited $SrTiO_3$, a monocrystalline seed of the film material can be generated locally which then can continue to grow laterally in the later heat treatment to form a monocrystalline film although the substrate is polycrystalline.

According to the embodiment shown, it was assumed that with a single pulse of an energy radiation, a seed is developed in the preliminary product V at its boundary surface 7 with the substrate, from which a crystal growth correlated with a subsequent heat treatment starts. It is, of course, also possible to develop seeds in several places of a preliminary product by suitable pulses. Thus, superconducting structures can be developed in the preliminary product by a sequence of laser pulses and a subsequent but incomplete heat treatment. Such structures can be, for instance, conductor runs or isolated superconducting regions.

It was further assumed in the embodiment described with the aid of the figures that the energy radiation E for forming the seed 2a is to take place only after the complete deposition of the layer 2 of the preliminary product V. However, it is also possible to start with the formation of seed already during the deposition process. Thereby, epitaxial growth of the desired superconducting metal oxide phase can optionally be promoted, which takes place even at low temperatures. The substrate temperature can also be chosen so that growth of the seed into the already deposited layer with the random preliminary product is possible.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a method for the preparation of at least one layer of a copper oxide based superconductor with a high transition temperature, comprising applying a layer on a predetermined substrate of a metal-oxide precursor of the components of the system with a structure still exhibiting faults with respect to a superconducting metal oxide phase to be formed and subsequently forming the desired superconducting metal-oxide phase using a heat treatment in an oxygen atmosphere, the improvement comprising forming a seed of the superconducting phase only in a locally limited region of the metal-oxide precursor at a boundary surface to the substrate by means of a solid-state reaction triggered by pulsed energy radiation, and then at least partially converting the preliminary product into the desired superconducting metal-oxide phase by heat treatment in the oxygen atmosphere at a predetermined temperature below 800° C.

2. The method recited in claim 1 wherein the heat treatment comprises heating at a temperature between 500° and 700° c.

3. The method recited in claim 1, wherein the seed formation is caused by the radiation of at least one light pulse of a laser, at least one of said substrate and said metal-oxide precursor being transparent, said light pulse being transmitted through said optically transparent substrate or said optically transparent metal-oxide precursor.

4. The method recited in claim 1, wherein the pulsed energy radiation takes place during the deposition of the metal-oxide precursor.

5. The method recited in claim 1, wherein a material is chosen for the substrate having lattice constants or unit cells having dimensions which are adapted at least approximately to the corresponding sizes of the crystals of the superconducting metal-oxide phase formed thereon.

6. The method recited in claim 1, wherein a monocrystalline substrate is provided.

7. The method recited in claim 1, wherein a substrate is provided which contains at least one of $Al_2O_3$, $ZrO_2$, MgO, $SrTiO_3$ or $BaTiO_3$.

8. The method recited in claim 1, wherein at least a thin layer of the substrate material is provided on a carrier.

9. The method recited in claim 1, wherein a physical or chemical process is provided for depositing the metal-oxide precursor, said physical or chemical process comprising at least one of a laser evaporation process, a sputtering process, a vapor deposition process by an electron beam source and a chemical vapor deposition process.

10. The method recited in claim 1, wherein an RF-aided laser evaporation of the separate metallic components of the system is provided as a physical deposition process while oxygen is being provided as gas and/or an ion stream.

11. The method recited in claim 1, wherein evaporation of the separate metallic components with the aid of suitable electron beam sources while oxygen is being supplied as a gas and/or an ion stream is provided as a physical deposition process.

12. The method recited in claim 1, wherein a metal-oxide precursor with a layer thickness of at most 100 μm is deposited.

13. The method recited in claim 12, wherein the layer thickness is at most 10 μm.

14. The method recited in claim 12, wherein the layer thickness is at most 1 μm.

15. The method recited in claim 1, wherein first, a metal-oxide precursor with a polycrystalline or amorphous structure, is formed.

16. The method recited in claim 1, wherein at least one layer of a superconducting Me1-Me2-Cu-O material is produced, wherein said component Me1 comprises a rare earth metal or yttrium and said component Me2 comprises an alkaline earth metal.

17. The method recited in claim 16, wherein the first metallic component Me1 is partially substituted by another rare earth metal.

18. The method recited in claim 16, wherein the second metallic component Me2 is substituted partially by another alkaline earth metal.

19. The method recited in claim 17, wherein the second metallic component Me2 is substituted partially by another alkaline earth metal.

20. The method recited in claim 16, wherein the copper or the oxygen is partially substituted by F.

21. The method recited in claim 17, wherein the copper or the oxygen is partially substituted by F.

22. The method recited in claim 18, wherein the copper or the oxygen is partially substituted by F.

23. The method recited in claim 16, wherein a metal-oxide superconducting Y-Ba-Cu-O system with an orthorhombic crystal structure is produced.

* * * * *